(12) United States Patent  (10) Patent No.: US 8,881,068 B2
Bashaboina et al.  (45) Date of Patent: Nov. 4, 2014

(54) OPTIMIZED OPTICAL PROXIMITY CORRECTION HANDLING FOR LITHOGRAPHIC FILLS

(71) Applicant: GLOBALFOUNDRIES Inc., Grand Cayman (KY)

(72) Inventors: Pavan Bashaboina, Fremont, CA (US); Sarah McGowan, San Francisco, CA (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 13/759,297

(22) Filed: Feb. 5, 2013

(65) Prior Publication Data

US 2014/0223392 A1    Aug. 7, 2014

(51) Int. Cl.
G06F 17/50    (2006.01)
G03F 1/00    (2012.01)

(52) U.S. Cl.
CPC ........................... *G03F 1/144* (2013.01)
USPC .............................................. 716/53; 716/54

(58) Field of Classification Search
USPC ................................................... 716/50–54
See application file for complete search history.

(56) References Cited

U.S. PATENT DOCUMENTS

| | | | |
|---|---|---|---|
| 5,862,058 A | 1/1999 | Samuels et al. | |
| 6,194,104 B1 | 2/2001 | Hsu | |
| 6,301,697 B1 | 10/2001 | Cobb | |
| 6,563,127 B2 | 5/2003 | Lin et al. | |
| 6,634,018 B2 | 10/2003 | Randall et al. | |
| 6,748,578 B2 | 6/2004 | Cobb | |
| 7,024,655 B2 | 4/2006 | Cobb | |
| 7,302,672 B2* | 11/2007 | Pack et al. | 430/5 |
| 7,546,574 B2 | 6/2009 | Torunoglu et al. | |
| 7,865,864 B2 | 1/2011 | Banerjee et al. | |
| 8,255,841 B2 | 8/2012 | Torunoglu | |
| 8,321,822 B2 | 11/2012 | Yang et al. | |
| 8,560,979 B2* | 10/2013 | Wong et al. | 716/53 |
| 2002/0026627 A1 | 2/2002 | Cobb | |
| 2006/0078805 A1* | 4/2006 | Hansen | 430/5 |
| 2007/0266364 A1* | 11/2007 | Pack et al. | 716/20 |
| 2011/0161894 A1 | 6/2011 | Word et al. | |
| 2012/0324405 A1 | 12/2012 | Torunoglu et al. | |

* cited by examiner

*Primary Examiner* — Binh Tat

(74) *Attorney, Agent, or Firm* — Hunter E. Webb; Keohane & D'Alessandro PLLC

(57) ABSTRACT

An approach for providing a fragmentation scheme for lithographic fills is provided. In a typical embodiment, a plurality of shapes in a lithographic (e.g., dummy) fill will be grouped/classified into a first set of shapes (e.g., a representative set of shapes) and a second set of shapes (e.g., a similar set of shapes). A set of points will be identified along the edges of the first set of shapes (e.g., at corners of the edges and at positions along the edges that are in alignment with corners of adjacent shapes) to yield an initial mask output. This initial mask output will be copied to the second set of shapes to yield a final mask output which may then be outputted using such an optimized fragmentation scheme.

16 Claims, 5 Drawing Sheets

OPTIMIZED OPTICAL PROXIMITY CORRECTION HANDLING FOR LITHOGRAPHIC FILLS

BACKGROUND

1. Technical Field

This invention relates generally to the field of lithography and, more particularly, to approaches for enhancing resolution in lithographic processes using high refractive index fluids (e.g., in immersion lithography).

2. Related Art

Optical proximity correction (OPC) is a photolithography enhancement technique commonly used to compensate for image errors due to diffraction or process effects. A need for OPC is seen mainly in the making of semiconductor devices and is due to the limitations of light to maintain edge placement integrity of an original design, after processing, into the etched image on the silicon wafer. Specifically, projected images often appear with irregularities such as line widths that are narrower or wider than designed. Other distortions such as rounded corners are driven by the resolution of the optical imaging tool and are harder to correct. OPC corrects these errors by moving edges or adding extra polygons to a pattern written on a photomask. This may be accomplished using pre-computed look-up tables based on width and spacing between features (known as rule-based OPC), or by using compact models to dynamically simulate the final pattern, and thereby drive the movement of edges to find the best solution (this is known as model-based OPC). For current mask generation, a POR standard fragmentation scheme is typically utilized for lithographic fills. The drawbacks of a POR process is that when used by lithographic fills, POR techniques increase OPC runtime, and adversely impact mask-write times.

SUMMARY OF THE INVENTION

In general, aspects of the present invention relate to an approach for providing a fragmentation scheme for lithographic fills. In a typical embodiment, a plurality of shapes in a lithographic (e.g., dummy) fill will be grouped/classified into a first set of shapes (e.g., a representative set of shapes) and a second set of shapes (e.g., a similar set of shapes). A set of points will be identified along the edges of the first set of shapes (e.g., at corners of the edges and at positions along the edges that are in alignment with corners of adjacent shapes) to yield an initial mask output. This initial mask output will be copied to the second set of shapes to yield a final mask output which may then be outputted as an optimized fragmentation scheme.

A first aspect of the present invention provides a fragmentation method for lithographic fills, comprising: identifying a plurality of shapes within a lithographic fill; classifying the plurality of shapes into a first set of shapes and a second set of shapes; identifying a set of points along a set of edges of the first set of shapes to yield an initial mask output; copying initial mask output to the second set of shapes to yield a final mask output; and outputting the final mask output.

A second aspect of the present invention provides a fragmentation method for lithographic fills, comprising: identifying a plurality of shapes within a lithographic fill; and determining a fill-specific, optimized fragmentation scheme for the lithographic fill, the fragmentation scheme comprising a set of points along edges of a plurality of shapes, the set of points being positioned at corners of each of the plurality of shapes, and at positions along the edges of each of the plurality of shapes that are in alignment with a corner of an adjacent shape of the lithographic fill.

A third aspect of the present invention provides a fragmentation method for lithographic fills, comprising: identifying a plurality of shapes within a lithographic fill; classifying the plurality of shapes into a first set of shapes and a second set of shapes; identifying a set of points along a set of edges of the first set of shapes to yield an initial mask output, the set of points being positioned at corners of the set of edges and at positions along the set of edges that are in alignment with corners of other shapes of the plurality of shapes; copying initial mask output to the second set of shapes to yield a final mask output; and outputting the final mask output.

BRIEF DESCRIPTION OF THE DRAWINGS

These and other features of this invention will be more readily understood from the following detailed description of the various aspects of the invention taken in conjunction with the accompanying drawings in which.

Figure 2:
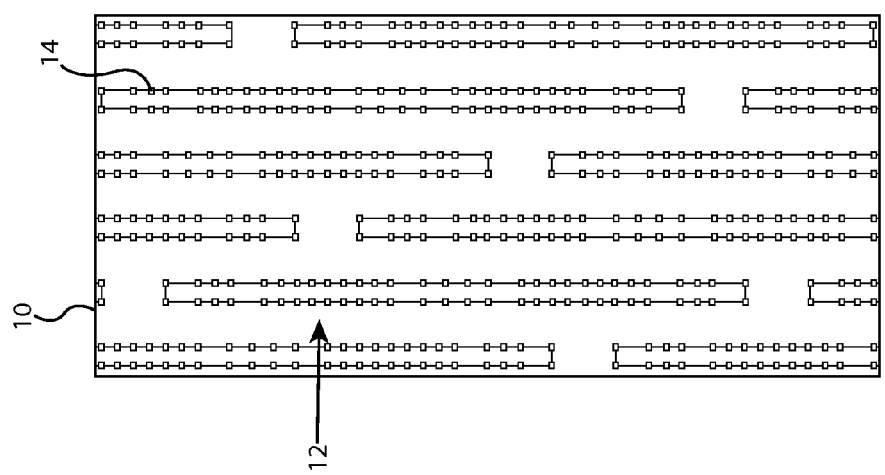
FIG. 2 shows a POR fragmentation scheme based on the fill of FIG. 1.

The drawings are not necessarily to scale. The drawings are merely representations, not intended to portray specific parameters of the invention. The drawings are intended to depict only typical embodiments of the invention, and therefore should not be considered as limiting in scope. In the drawings, like numbering represents like elements.

DETAILED DESCRIPTION OF THE INVENTION

Illustrative embodiments will now be described more fully herein with reference to the accompanying drawings, in which embodiments are shown. This disclosure may, however, be embodied in many different forms and should not be construed as limited to the embodiments set forth herein. Rather, these embodiments are provided so that this disclosure will be thorough and complete and will fully convey the scope of this disclosure to those skilled in the art. In the description, details of well-known features and techniques may be omitted to avoid unnecessarily obscuring the presented embodiments.

The terminology used herein is for the purpose of describing particular embodiments only and is not intended to be limiting of this disclosure. As used herein, the singular forms "a", "an", and "the" are intended to include the plural forms as well, unless the context clearly indicates otherwise. Furthermore, the use of the terms "a", "an", etc., do not denote a limitation of quantity, but rather denote the presence of at least one of the referenced items. The term "set" is intended to mean a quantity of at least one. It will be further understood that the terms "comprises" and/or "comprising", or "includes" and/or "including", when used in this specification, specify the presence of stated features, regions, integers, steps, operations, elements, and/or components, but do not preclude the presence or addition of one or more other features, regions, integers, steps, operations, elements, components, and/or groups thereof.

Reference throughout this specification to "one embodiment," "an embodiment," "embodiments," "exemplary embodiments," or similar language means that a particular feature, structure, or characteristic described in connection with the embodiment is included in at least one embodiment of the present invention. Thus, appearances of the phrases "in one embodiment," "in an embodiment," "in embodiments" and similar language throughout this specification may, but do not necessarily, all refer to the same embodiment.

The terms "overlying" or "atop", "positioned on" or "positioned atop", "underlying", "beneath" or "below" mean that a first element, such as a first structure (e.g., a first layer) is present on a second element, such as a second structure (e.g. a second layer) wherein intervening elements, such as an interface structure (e.g. interface layer) may be present between the first element and the second element.

Immersion lithography is a photolithography resolution enhancement technique for manufacturing integrated circuits (ICs) that replaces the usual air gap between the final lens and the wafer surface with a liquid medium that has a refractive index greater than one. The resolution is increased by a factor equal to the refractive index of the liquid. Current immersion lithography tools use highly purified water for this liquid, achieving feature sizes below 45 nanometers.

As indicated above, aspects of the present invention relate to an approach for providing a fragmentation scheme for lithographic fills. In a typical embodiment, a plurality of shapes in a lithographic (e.g., dummy) fill will be grouped/classified into a first set of shapes (e.g., a representative set of shapes) and a second set of shapes (e.g., a similar set of shapes). A set of points will be identified along the edges of the first set of shapes (e.g., at corners of the edges and at positions along the edges that are in alignment with corners of adjacent shapes) to yield an initial mask output. This initial mask output will be copied to the second set of shapes to yield a final mask output which may then be outputted.

In general, the performance of both etch and chemical mechanical polishing (CMP) processes is influenced by the uniformity of the design structures across the wafer, and thus the need for a uniform design has increased in advanced nodes. One way to control the uniformity of the design is by making the "dummy" fills more custom and design-like. For example, at 28 nm and smaller nodes, the dummy fill may be expected to be closer to minimum design rules. Because there may be no prior knowledge of the kind of dummy fill strategies employed by a customer (whose dimensions are at minimum design rules), the design shapes should be treated as electrically active design shapes. For mask data generation, drawn design and customer fills may be handled in a unique way, by using one standard fragmentation scheme (e.g., a POR process). As indicated above, previous approaches (among other things) increased the OPC runtime, and also greatly increased mask-write times. As such, approaches of the present invention provide a fragmentation scheme for customer dummy fill that is both customized and optimized for each customer fill.

Figure 1:
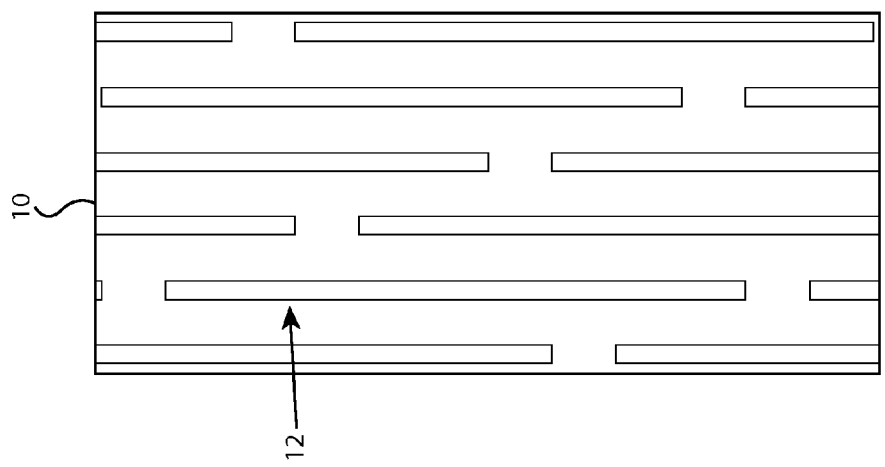
FIG. 1 shows a lithographic fill according to an embodiment of the present invention

Referring now to FIG. 1, a lithographic fill 10 is shown. As depicted, the fill comprises a plurality of shapes 12. In providing a fragmentation scheme for fill 10 a mask output will be determined. FIG. 2 depicts a fragmentation scheme as determined according to a prior technique. As depicted, a set of (fragmentation) points are identified and placed along edges of shapes. The line segments between these points, called as fragments, are moved inside or outside according to OPC model, and this fragmentation scheme is utilized to produce a final mask output. As shown, points 14 are set along edges according to a predetermined pattern (e.g., according to predetermined spacing). Such an implementation fails to allow for a customized approach.

Figure 3:
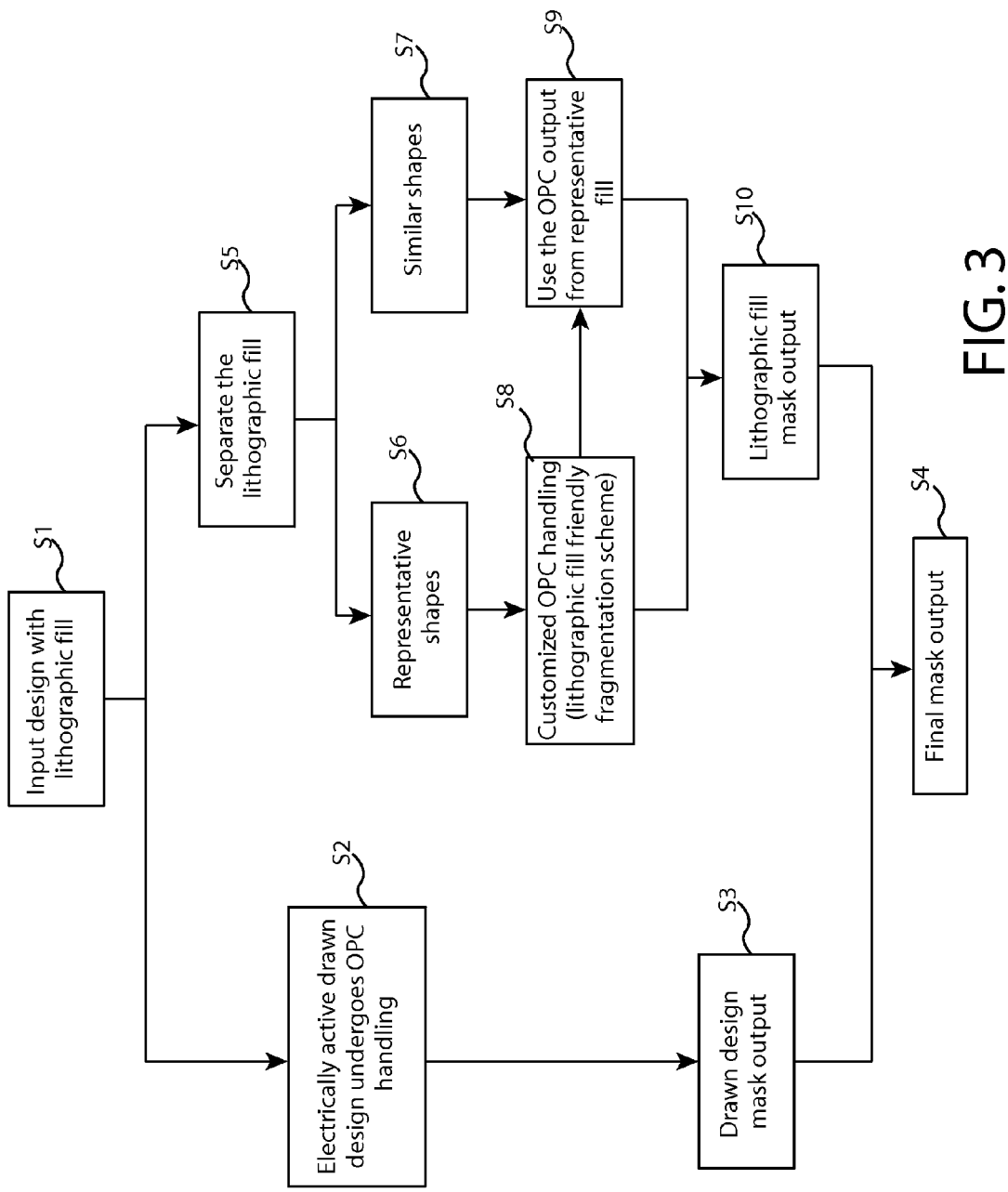
FIG. 3 depicts a method flow diagram according to an embodiment of the present invention.

Referring to FIG. 3, a method flow diagram showing the process of FIG. 2 (steps S2-S3) in parallel with a process according to an embodiment of the present invention (steps S5-S10) is shown. As depicted, both processes commence with receiving an input design (e.g., a lithographic/dummy fill) in step S1. In step S2, an electrically active drawn design undergoes a standard OPC handling, and in step S3, a drawn design mask is output as a final mask output in step S4. In the POR process, the lithographic fill, especially the dummy fill generated at customer site, also follows the same procedure, (steps S2-S3), as electrically active design shapes, and the drawback of doing so is more OPC runtime and more mask write times. However, by following the method mentioned in this invention, we can achieve sufficient accuracy needed for lithographic fill shape, and achieve performance improvements with regards to OPC runtime and mask write times. Under the process of the present invention, the customer's fill is classified/grouped in step S5 into representative shape(s) (step S6) and similar shape(s) (step S7).

Figure 4:
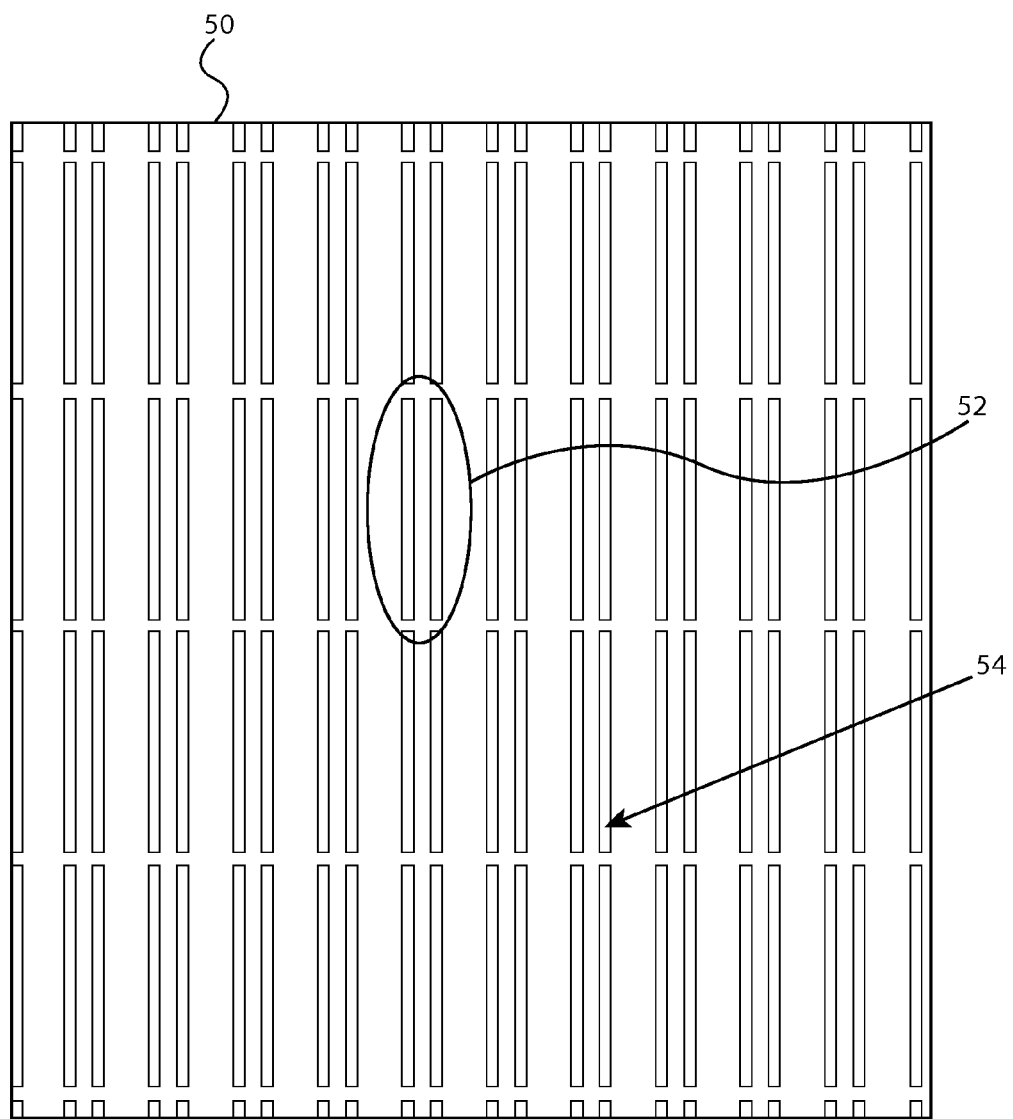
FIG. 4 shows a selection of representative fill shapes in a particular dummy fill, according to an embodiment of the present invention.
Figure 5:
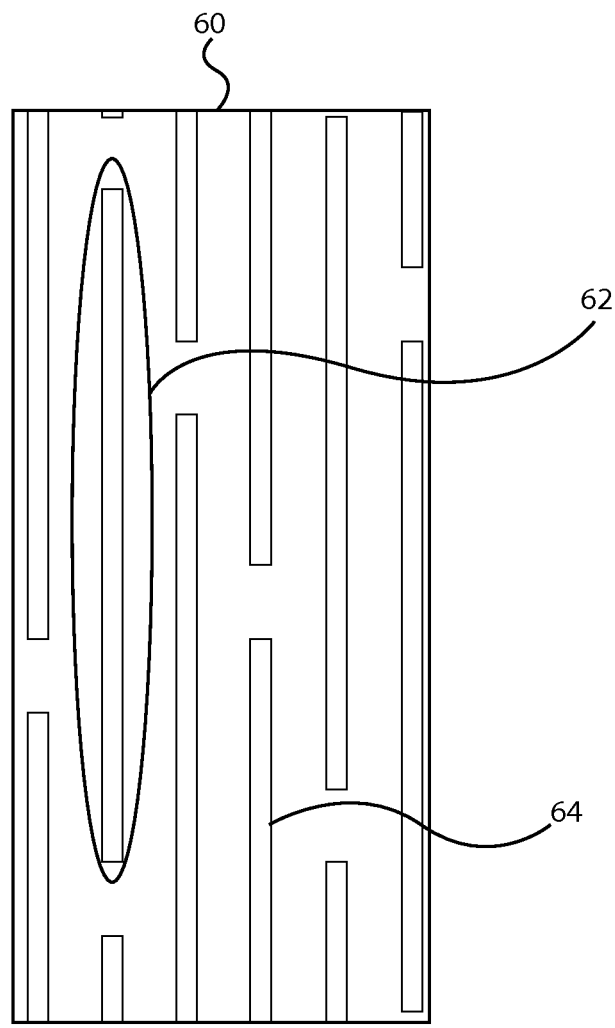
FIG. 5 shows a selection of representative fill shapes, in another example of dummy fill, according to an embodiment of the present invention.

The separation/classifying may occur via multiple techniques. A first technique is shown via a fill 50 in FIG. 4. As depicted a pair of shapes 52 are identified/classified as representative shapes 54 (e.g., all other shapes) are then identified/classified as similar. Another technique is shown via the fill 60 of in FIG. 5. As depicted, an individual shape 62 is identified as representative, and all other shapes 64 are then individually identified as similar thereto.

Figure 6:
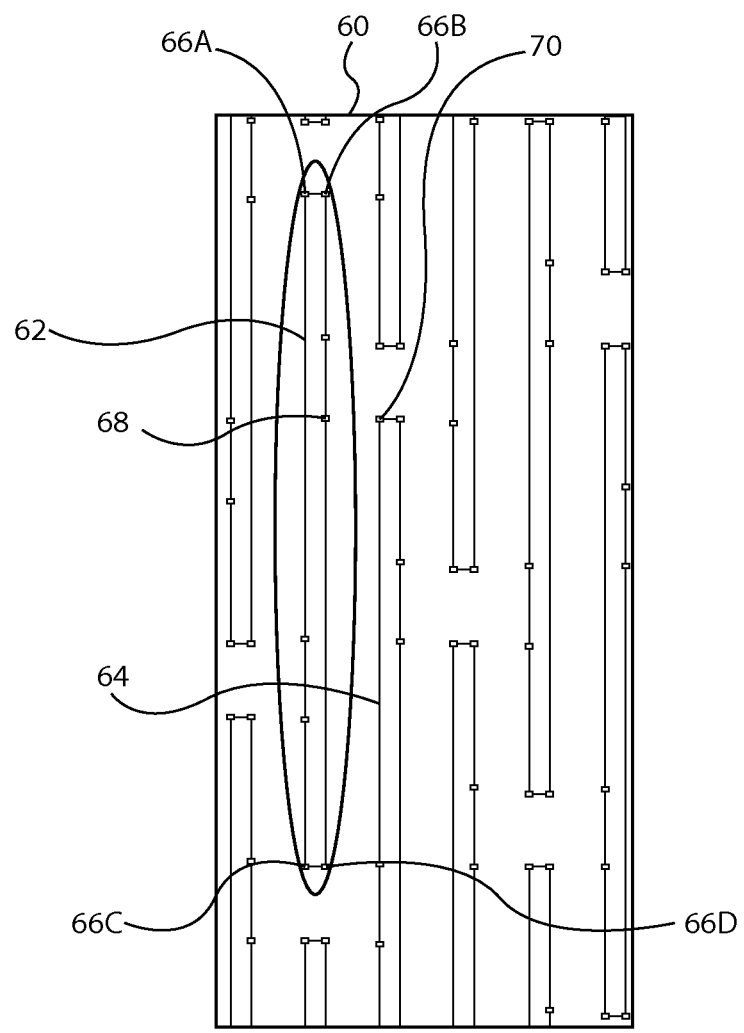
FIG. 6 shows a final mask edge fragments based on the fragmentation schemes of the FIG. 3 or 4 according to an embodiment of the present invention.

Referring back to FIG. 3, in step S8, a customized OPC handling technique is applied to the representative shapes. This will include identifying a set of points along the edges of the representative shape(s). An example of this with respect to fill 60 is shown in FIG. 6. In one embodiment, representative shape 62 may have points applied along corners of the edges thereof and/or at positions that are in alignment with corners of adjacent shapes. For example, shape 62 has points at each corner thereof, and at positions such as position 68 that are in alignment with corners of other shapes such as corner 70 of shape 64. The placement of these mask point(s) will be used for the generation of mask output. Regardless of the technique, referring back to FIG. 3, in step S9, the initial mask output from the OPC handling process of step S8 is copied to the similar set of shapes (e.g., shape 64 of FIG. 5) and processed in step S9 to yield a final mask output in step S10. This final mask output may then be provided to a designer or the like in step S4.

In various embodiments, design tools can be provided and configured to create the data sets used to pattern the semiconductor layers as described herein. For example, data sets can be created to generate photomasks used during lithography operations to pattern the layers for structures as described herein. Such design tools can include a collection of one or more modules and can also include hardware, software, or a combination thereof. Thus, for example, a tool can be a collection of one or more software modules, hardware modules, software/hardware modules, or any combination or permutation thereof. As another example, a tool can be a computing device or other appliance on which software runs or in which hardware is implemented. As used herein, a module might be implemented utilizing any form of hardware, software, or a combination thereof. For example, one or more processors, controllers, application-specific integrated circuits (ASIC), programmable logic arrays (PLA)s, logical components, software routines, or other mechanisms might be implemented to make up a module. In implementation, the various modules described herein might be implemented as discrete modules or the functions and features described can be shared in part or in total among one or more modules. In other words, as would be apparent to one of ordinary skill in the art after reading this description, the various features and functionality described herein may be implemented in any given application and can be implemented in one or more separate or shared modules in various combinations and permutations. Even though various features or elements of functionality may be individually described or claimed as separate modules, one of ordinary skill in the art will understand that these features and functionality can be shared among one or more common software and hardware elements, and such description shall not require or imply that separate hardware or software components are used to implement such features or functionality.

While the invention has been particularly shown and described in conjunction with exemplary embodiments, it will be appreciated that variations and modifications will occur to those skilled in the art. For example, although the illustrative embodiments are described herein as a series of acts or events, it will be appreciated that the present invention is not limited by the illustrated ordering of such acts or events unless specifically stated. Some acts may occur in different orders and/or concurrently with other acts or events apart from those illustrated and/or described herein, in accordance with the invention. In addition, not all illustrated steps may be required to implement a methodology in accordance with the present invention. Furthermore, the methods according to the present invention may be implemented in association with the formation and/or processing of structures illustrated and described herein as well as in association with other structures not illustrated. Therefore, it is to be understood that the appended claims are intended to cover all such modifications and changes that fall within the true spirit of the invention.

What is claimed is:

1. A fragmentation method for lithographic fills, comprising:
    identifying a plurality of shapes within a lithographic fill;
    classifying the plurality of shapes into a first set of shapes and a second set of shapes, each of the first set of shapes having a shape that is representative of at least one of the second set of shapes;
    identifying a set of points along a set of edges of the first set of shapes to yield an initial mask output, the identifying comprising:
        identifying a first set of points positioned at corners of each of the first set of shapes;
        identifying a second set of points positioned along the edges of each of the first set of shapes that are in alignment with a corner of an adjacent shape of the lithographic fill; and
        performing optical proximity correction (OPC) on the first set of shapes but not on the second set of shapes;
    copying, using a computer device, initial mask output of one of the first set of the first set of shapes to corresponding ones of the second set of shapes to yield a final mask output; and
    outputting the final mask output.

2. The fragmentation method of claim 1, the lithographic fill comprising a lithographic fill.

3. The fragmentation method of claim 1, the plurality of shapes corresponding to a lithographic mask.

4. The fragmentation method of claim 1, the plurality of shapes being electrically active.

5. The fragmentation method of claim 1, the optimized fragmentation scheme yielding a mask output.

6. A fragmentation method for lithographic fills, comprising:
    identifying a plurality of shapes within a lithographic fill, the plurality of shapes being a subset of shapes that have a shape that is representative of an entirety of the shapes; and
    determining, using a computer device, a fill-specific, optimized fragmentation scheme for the lithographic fill, the fragmentation scheme comprising a set of points along edges of plurality of shapes but not on shapes within the lithographic fill that are represented by the plurality of shapes, the set of points being positioned at corners of each of the plurality of shapes, and at positions along the edges of each of the plurality of shapes that are in alignment with a corner of an adjacent shape of the lithographic fill and the optimized fragmentation scheme further comprising an optical proximity correction (OPC) on the plurality of shapes but not on the shapes within the lithographic fill that are represented by the plurality of shapes.

7. The fragmentation method of claim 6, further comprising using the plurality of shapes after the OPC for similar shapes corresponding to the plurality of shapes.

8. The fragmentation method of claim 6, the lithographic fill comprising a lithographic fill.

9. The fragmentation method of claim 6, the plurality of shapes corresponding to a lithographic mask.

10. The fragmentation method of claim 6, the plurality of shapes being electrically active.

11. The fragmentation method of claim 6, further comprising:
    classifying the plurality of shapes into a first set of shapes and a second set of shapes;
    identifying the set of points for the first set of shapes; and
    copying an output of the identifying to the second set of shapes.

12. The fragmentation method of claim 6, further comprising a mask produced according to the method of claim 1.

13. A fragmentation method for lithographic fills, comprising:
    identifying a plurality of shapes within a lithographic fill;
    classifying the plurality of shapes into a first set of shapes and a second set of shapes, each of the first set of shapes having a shape that is representative of at least one of the second set of shapes;
    identifying a set of points along a set of edges of the first set of shapes to yield an initial mask output, the set of points being positioned at corners of the set of edges and at positions along the set of edges that are in alignment with corners of other shapes of the plurality of shapes;
    performing optical proximity correction (OPC) on the first set of shapes but not on the second set of shapes;
    copying, using a computer device, initial mask output of one of the first set of the first set of shapes to corresponding ones of the second set of shapes to yield a final mask output; and
    outputting the final mask output.

14. The fragmentation method of claim 13, the lithographic fill comprising a lithographic fill.

15. The fragmentation method of claim 13, the plurality of shapes corresponding to a lithographic mask.

16. The fragmentation method of claim 13, the plurality of shapes being electrically active.

* * * * *